US012796524B2

(12) United States Patent
Lee

(10) Patent No.: US 12,796,524 B2
(45) Date of Patent: Nov. 10, 2026

(54) SEMICONDUCTOR DEVICES AND METHODS OF MANUFACTURING SEMICONDUCTOR DEVICES

(71) Applicant: Amkor Technology Singapore Holding Pte. Ltd., Singapore (SG)

(72) Inventor: Cheol Ho Lee, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 5 days.

(21) Appl. No.: 18/133,291

(22) Filed: Apr. 11, 2023

(65) Prior Publication Data

US 2023/0245937 A1 Aug. 3, 2023

Related U.S. Application Data

(63) Continuation of application No. 16/877,652, filed on May 19, 2020, now Pat. No. 11,626,337.

(51) Int. Cl.
*H10W 74/10* (2026.01)
*H10P 54/00* (2026.01)
(Continued)

(52) U.S. Cl.
CPC ............. *H10W 74/10* (2026.01); *H10P 54/00* (2026.01); *H10W 72/0198* (2026.01); *H10W 90/00* (2026.01)

(58) Field of Classification Search
CPC ..... H01L 2225/06548; H01L 23/49811; H01L 23/5389; H01L 25/065–0657; H01L 2225/065–06596; H01L 2225/1005–1094; H01L 23/552–556; H01L 23/3135; H10W 42/276; H10W 42/20; H10W 70/09; H10W 70/60;
(Continued)

(56) References Cited

U.S. PATENT DOCUMENTS 8,058,715 B1 11/2011 Roa et al.
10,879,192 B1 * 12/2020 Kuan .................. H01L 23/5385
(Continued)

OTHER PUBLICATIONS

Office Action for Taiwan Application No. 110114900 mailed Jul. 9, 2025.

*Primary Examiner* — Leonard Chang
*Assistant Examiner* — Stanetta D Isaac
(74) *Attorney, Agent, or Firm* — Spectrum IP Law Group LLC

(57) ABSTRACT

In one example, a semiconductor device comprises a main substrate comprising a first side and a main conductive structure, and a first component module over the first side of the main substrate. The first component module comprises a first electronic component and a first module encapsulant contacting a lateral side of the first electronic component. The semiconductor device further comprises a second component module over the first side of the main substrate. The second component module comprises a second electronic component and a second module encapsulant contacting a lateral side of the second electronic component. The semiconductor device further comprises a main encapsulant over a first side of the main substrate and between the first component module and the second component module. Other examples and related methods are also disclosed herein.

19 Claims, 12 Drawing Sheets

(51) Int. Cl.
*H10W 72/00* (2026.01)
*H10W 90/00* (2026.01)

(58) Field of Classification Search
CPC ......... H10W 70/6528; H10W 72/0198; H10W 72/241; H10W 72/9413; H10W 74/10; H10W 74/014; H10W 74/01; H10W 74/117; H10W 90/00; H10W 90/10; H10P 72/74; H10P 72/743; H10P 54/00
See application file for complete search history.

(56) References Cited

U.S. PATENT DOCUMENTS

| | | | | |
|---|---|---|---|---|
| 2011/0006408 | A1* | 1/2011 | Liao | H01L 23/552 257/E23.114 |
| 2013/0105950 | A1 | 5/2013 | Bergemont et al. | |
| 2017/0133326 | A1 | 5/2017 | Dang et al. | |
| 2017/0345793 | A1* | 11/2017 | Miyairi | H01L 24/02 |
| 2018/0012857 | A1* | 1/2018 | Lin | H01L 21/561 |
| 2018/0286816 | A1* | 10/2018 | Kitazaki | H01L 23/3121 |
| 2019/0244907 | A1* | 8/2019 | Liao | H01L 23/5389 |
| 2020/0066663 | A1* | 2/2020 | Aleksov | H01L 23/00 |
| 2020/0090954 | A1 | 3/2020 | Lin et al. | |
| 2020/0219790 | A1* | 7/2020 | Uppal | H01L 24/17 |

* cited by examiner

SEMICONDUCTOR DEVICES AND METHODS OF MANUFACTURING SEMICONDUCTOR DEVICES

CROSS-REFERENCE TO RELATED APPLICATIONS

The present application is a continuation of U.S. application Ser. No. 16/877,652 filed May 19, 2020. Said application Ser. No. 16/877,652 and Pub. No. US 2021/0366800 A1 are hereby incorporated herein by reference in their entireties.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1:
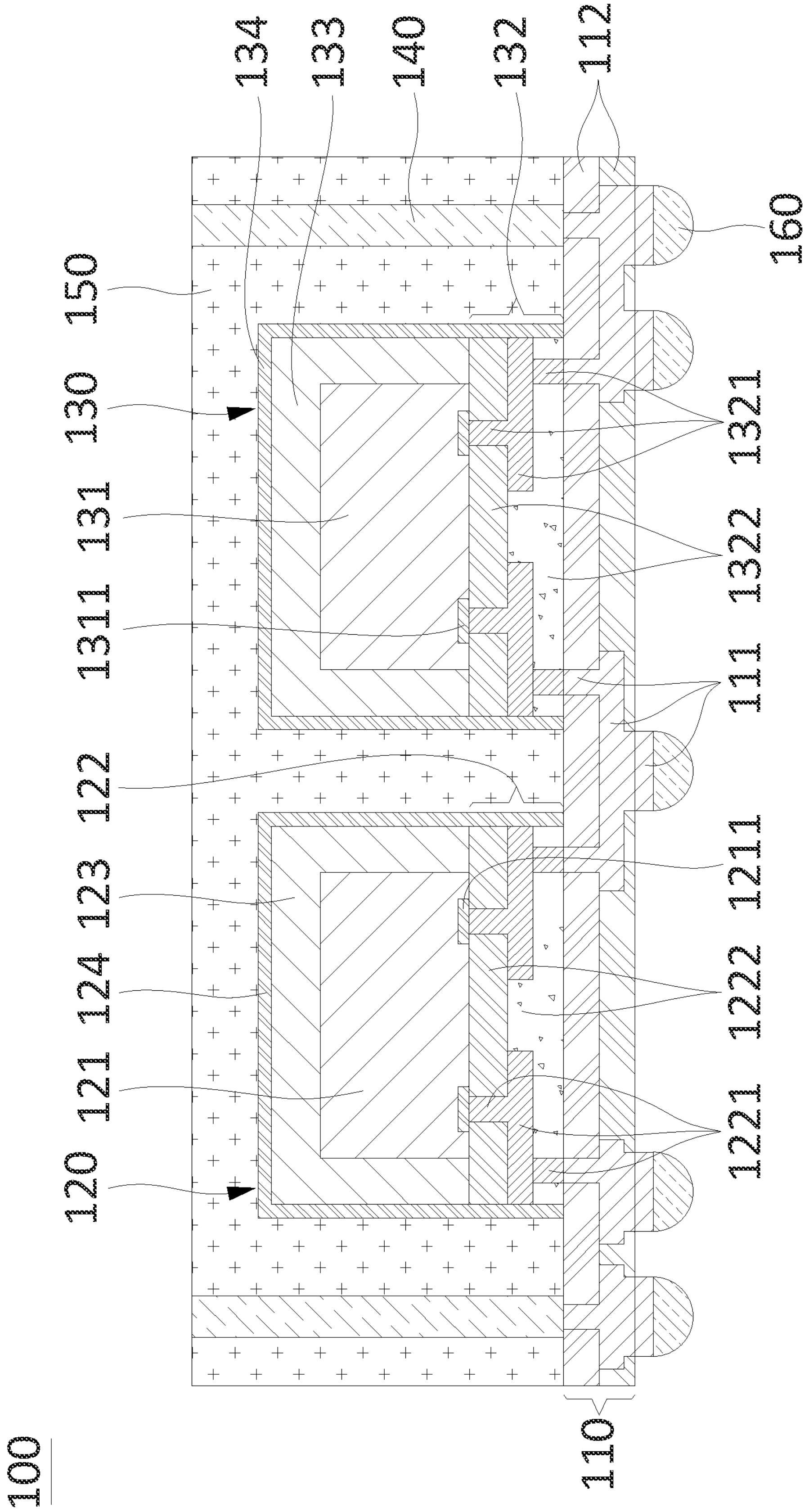
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

The terms "comprises," "comprising," "includes," or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In a one example, a semiconductor device comprises a main substrate comprising a first side and a main conductive structure, and a first component module over the first side of the main substrate. The first component module comprises a first electronic component and a first module encapsulant contacting a lateral side of the first electronic component. The semiconductor device further comprises a second component module over the first side of the main substrate. The second component module comprises a second electronic component and a second module encapsulant contacting a lateral side of the second electronic component. The semiconductor device further comprises a main encapsulant over the first side of the main substrate and between the first component module and the second component module.

In another example, a method of manufacturing a semiconductor device comprises providing a main substrate comprising a first side and a main conductive structure, providing a first component module over the first side of the main substrate, the first component module comprising a first electronic component and a first module encapsulant contacting a lateral side of the first electronic component, providing a second component module over the first side of the main substrate, the second component module comprising a second electronic component, and a second module encapsulant contacting a lateral side of the second electronic component, and encapsulating the first side of the main substrate and lateral sides of the first and second component modules with a main encapsulant.

In a further example, a method of manufacturing a semiconductor device comprises providing a plurality of electronic components in a module encapsulant, wherein component terminals of the electronic components are exposed external to the module encapsulant, providing a module substrate over the electronic components, wherein a module conductive structure of the module substrate is coupled with the component terminals, singulating the module encapsulant to provide a plurality of component modules, providing the component modules on a carrier, providing a main encapsulant over the carrier and contacting lateral sides of the component modules, removing the carrier, providing a main substrate over the main encapsulant, and singulating the main encapsulant to provide a semiconductor device comprising two component modules.

Other examples are included in the present disclosure. Such examples may be found in the figures, in the claims, or in the description of the present disclosure.

FIG. 1 shows a cross-sectional view of an example semiconductor device. In the example shown in FIG. 1, semiconductor device 100 can comprise main substrate 110, component module 120, component module 130, vertical interconnects 140, main encapsulant 150, and external interconnects 160.

Main substrate 110 can comprise main conductive structure 111 and main dielectric structure 112. Component module 120 can comprise electronic component 121, module substrate 122, module encapsulant 123, and shield 124. Component module 130 can comprise electronic component 131, module substrate 132, module encapsulant 133, and shield 134. In some examples, shields 124 or 134 can contact a lateral side of module encapsulant 123 or 133 and can be between component modules 120 and 130. Component module 120 and component module 130 can be over or coupled to the back side of main substrate 110, and can be similar to each other in some implementations. Main encapsulant 150 can be over the back side of main substrate 110 and can be between component module 120 and component module 130. Main encapsulant 150 can cover a major side of shields 124 or 134. Vertical interconnect 140 can be in main encapsulant 150 and can be coupled with main conductive structure 111. In some examples, an end of vertical interconnect 140 can be exposed external to main encapsulant 110. Electronic components 121 or 131 can comprise component terminals 1211 or 1311, respectively. Module substrates 122 or 132 can comprise module conductive structures 1221 or 1321 and module dielectric structures 1222 or 1322, respectively. In some examples, component modules 120 or 130 can comprise module substrates 122 or 132. Module substrates 122 or 132 can comprise module conductive structures 1221 or 1321 which can be coupled with electronic components 121 or 131 and main conductive structure 111. In some examples, shields 124 or 134 can be coupled with module conductive structures 1221 or 1321. External interconnects 160 can be located at the front side of main substrate 110.

Main substrate 110, vertical interconnects 140, main encapsulant 150 and external interconnects 160 can be referred to as a semiconductor package or a package, which can provide protection for component module 120 or component module 130 from external elements or environmental exposure. The semiconductor package can provide electrical couplings between an external component and component modules 120 or 130.

Figure 2A:
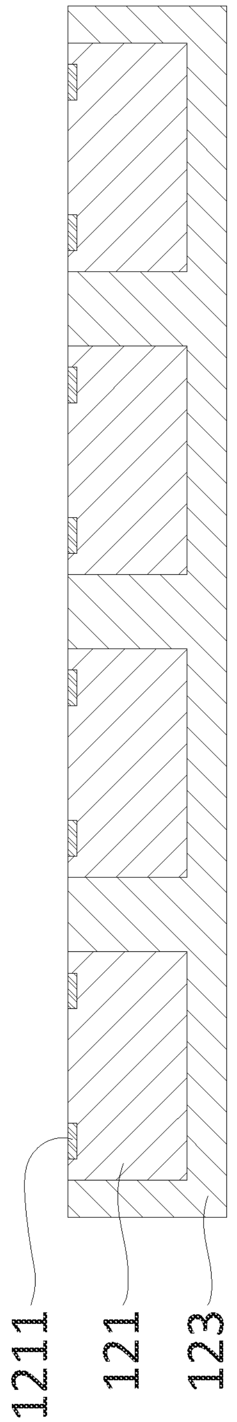
FIGS. 2A to 2I show cross-sectional views of an example method for manufacturing an example semiconductor device.

FIGS. 2A to 21 show cross-sectional views of an example method for manufacturing an example semiconductor device. FIG. 2A shows a cross-sectional view of semiconductor device 100 at an early stage of manufacture.

In the example shown in FIG. 2A, module encapsulant 123 can encapsulate more than one electronic components 121. Electronic components 121 can comprise a front side with component terminals 1211 wherein component terminals 1211 can be exposed external to module encapsulant 123. In some examples, electronic components 121 can be placed on a carrier such that the front side having the component terminals 1211 faces downward, and module encapsulant 123 can encapsulate lateral sides or back sides opposite to the front sides of electronic components 121. Then, the carrier can be removed and electronic component 121 and module encapsulant 123 can be turned over to make the front side having component terminal 1211 face upward. In some examples, module encapsulant 123 can be provided or formed between each of the electronic components 121. Module encapsulant 123 can expose front sides of electronic components 121 and component terminals 1211.

Electronic component 121 can comprise or be referred to as a semiconductor die, chip, or package. In some examples, electronic component 121 can comprise a semiconductor package, such as a chip scale package. Electronic component 121 can comprise, for example, a semiconductor material such as silicon (Si). Electronic component 121 can comprise passive devices such as a resistor, a capacitor, an inductor, or an antenna, or active devices such as transistors. For example, electronic component 121 can comprise an electronic circuit, such as a memory, a digital signal processor (DSP), a microprocessor, a network processor, a power management processor, an audio processor, a radio-frequency (RF) circuit, a wireless baseband system-on-chip (SoC) processor, a sensor, or an application specific integrated circuit (ASIC). In some examples, electronic component 121 can have thickness in the range from about 100 micrometers (μm) to about 1500 μm. In some examples, the different electronic components 121 encapsulated by module encapsulant 123 can be different from each other in terms or functions or dimensions.

In some examples, component terminal 1211 can comprise or be referred to as a pad, a bond pad, a land, a bump, a pillar, a trace, a wiring layer, or a metal layer. In some examples, component terminal 1211 can comprise an electrically conductive material, such as copper (Cu), aluminum (Al), palladium (Pd), titanium (Ti), tungsten (W), titanium/tungsten, nickel (Ni), gold (Au), or silver (Ag). Component terminal 1211 can provide an electrical contact between electronic component 121 and module substrate 122. In some examples, component terminal 1211 can have a vertical thickness in the range from about 200 nanometers (nm) to about 300 nm. In some examples, component terminal 1211 can protrude relative to the rest of the front side of electronic component 121.

Module encapsulant 123 can comprise or be referred to as a protective material, a mold compound, or a resin. In some examples, module encapsulant 123 can comprise a variety of encapsulating or molding materials, for example a resin, a polymer compound, a polymer having inorganic fillers, an epoxy resin, an epoxy resin having fillers, an epoxy acrylate having fillers, or a silicone resin. Module encapsulant 123 can be formed by any of a variety of processes, for example a compression molding process, a liquid phase encapsulant molding process, a vacuum lamination process, a paste printing process, or a film assisted molding process. Module encapsulant 123 can have a thickness in the range from about 20 μm to about 1500 μm. Module encapsulant 123 can provide protection for electronic component 121 from external elements or environmental exposure.

Figure 2B:
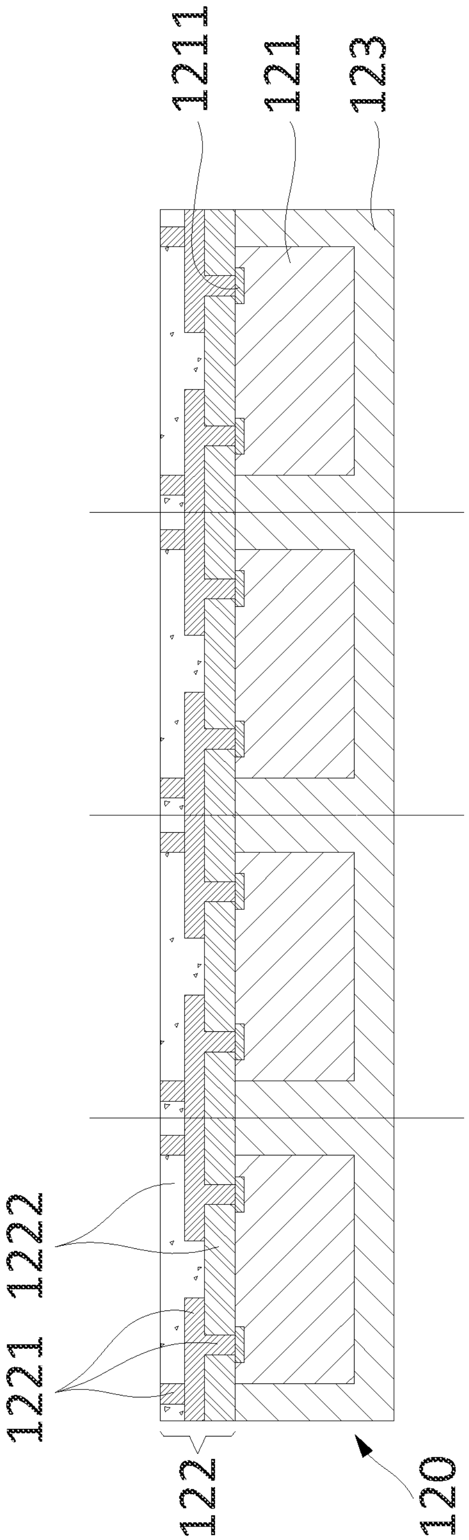

FIG. 2B shows a cross-sectional view of semiconductor device 100 at a later stage of manufacture. In the example shown in FIG. 2B, module substrate 122 comprising module conductive structure 1221 and module dielectric structure 1222 can be formed on or provided over electronic component 121 and module encapsulant 123. Module substrate 122 can be formed on the front side of electronic component 121 having component terminal 1211. In some examples, module substrate 122 can be formed to extend onto module encapsulant 123 formed between each of electronic components 121 on the front side of electronic component 121. In some examples, module conductive structure 1221 of module substrate 122 can be coupled with component terminals 1211.

In some examples, module substrate 122 can comprise or be referred to as a redistribution structure, a redistribution layer (RDL) substrate, a buildup substrate, a wafer-level or panel-level substrate, or a fan-out substrate. In some examples, module substrate 122 can comprise a laminate substrate or a pre-formed substrate. Module substrate 122 can provided electrical connection between electronic component 121 and main substrate 110. Module substrate 122 can extend beyond a footprint of electronic component 121 to form a fan-out redistribution structure. In some examples, module substrate 122 can have a thickness in the range from about 4 μm to about 200 μm.

Module conductive structure 1221 can comprise or be referred to as one or more traces, pads, terminals, vias, Under-Bump Metallizations (UBMs), conductors, conductive materials, conductive patterns, conductive paths, conductive layers, redistribution layers (RDL), wiring patterns, trace patterns, or circuit patterns. Module conductive structure 1221 can comprise an electrically conductive material such as copper (Cu), aluminum (Al), palladium (Pd), titanium (Ti), tungsten (W), titanium/tungsten, nickel (Ni), gold (Au), or silver (Ag). Module conductive structure 1221 can be formed by any of a variety of processes, for example electroplating, electroless plating, sputtering, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). Module conductive structure 1221 can be electrically connected to component terminal 1211. Module conductive structure 1221 can transfer or redistribute signals, current or voltages through module substrate 122. In some examples, module conductive structure 1221 can have a thickness in the range from about 4 μm to about 200 μm.

In some examples, module dielectric structure 1222 can comprise or be referred to as one or more dielectric layers, passivation layers, thin-film layers, or buildup layers. In some examples, module dielectric structure 1222 can comprise or be referred to as one or more dielectric layers, solder mask layers, core layers, or prepreg layers. Module dielectric structure 1222 can comprise an electrically insulating material such as a polymer, polyimide (PI), polypropylene (PP), polyethylene (PE), benzocyclobutene (BCB), polybenzoxazole (PBO), bismaleimide triazine (BT), a molding material, a phenol resin, epoxy, silicone, or an acrylate polymer. In some examples, module dielectric structure 1222 can be formed by thermal oxidation, chemical vapor deposition (CVD), physical vapor deposition (PVD), atomic layer deposition (ALD), low pressure chemical vapor deposition (LPCVD), plasma enhanced chemical vapor deposition (PECVD), sheet lamination, printing, spin coating, spray coating, sintering, or evaporating. Module dielectric structure 1222 can provide structural integrity or protection for module conductive structure 1221 from external elements or environmental exposure. In some examples, module dielectric structure 1222 can expose a terminal of module conductive structure 1221 from module substrate 122. In some examples, module dielectric structure 1222 can have a thickness in the range from about 4 μm to about 200 μm.

In some examples, module substrate 122 can comprise a redistribution layer ("RDL") substrate. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as an electroplating process or an electroless plating process. The conductive patterns can comprise an electrically conductive material such as copper or other plateable metal. The locations of the conductive patterns can be made using a photo-patterning process, for example a photolithography process and a photoresist material to form a photolithographic mask. The dielectric layers of the RDL substrate can be patterned with a photo-patterning process that can include a photolithographic mask through which light is exposed to photo-pattern desired features such as vias in the dielectric layers. The dielectric layers can be made from photo-definable organic dielectric materials, for example polyimide (PI), benzocyclobutene (BCB), or polybenzoxazole (PBO). Such dielectric materials can be spun-on or otherwise coated in liquid form rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. In some examples, the one or more inorganic dielectric layers can comprise silicon nitride ($Si_3N_4$), silicon oxide ($SiO_2$), or silicon oxynitride (SiON). The one or more inorganic dielectric layers can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as a dielectric material comprising bismaleimide triazine (BT) or FR4, and these types of RDL substrates can be referred to as a coreless substrate. Other substrates discussed herein can also comprise an RDL substrate.

In some examples, module substrate 122 can comprise a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as a dielectric material comprising bismaleimide triazine (BT) or FR4, and dielectric and conductive layers can be formed on the permanent core structure. In other examples, the pre-formed substrate can be a coreless substrate that omits the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such a pre-formed substrate can be formed through a semi-additive or modified-semi-additive process. Other substrates in this disclosure can also comprise a pre-formed substrate.

In the example shown in FIG. 2B, a singulation or sawing process can be performed to separate electronic components 121 from one another to provide a plurality of component modules 120. In some examples, the singulation or sawing process can be performed using a sawing tool, such as a blade or laser beam. During the singulation process, module substrate 122 can be singulated through module encapsulant 123 and, electronic components 121 can be separated from one another along the shown singulation lines. In some examples, the singulated electronic component 121, module encapsulant 123 and module substrate 122, can be referred to as a module package or component module 120.

Figure 2C:
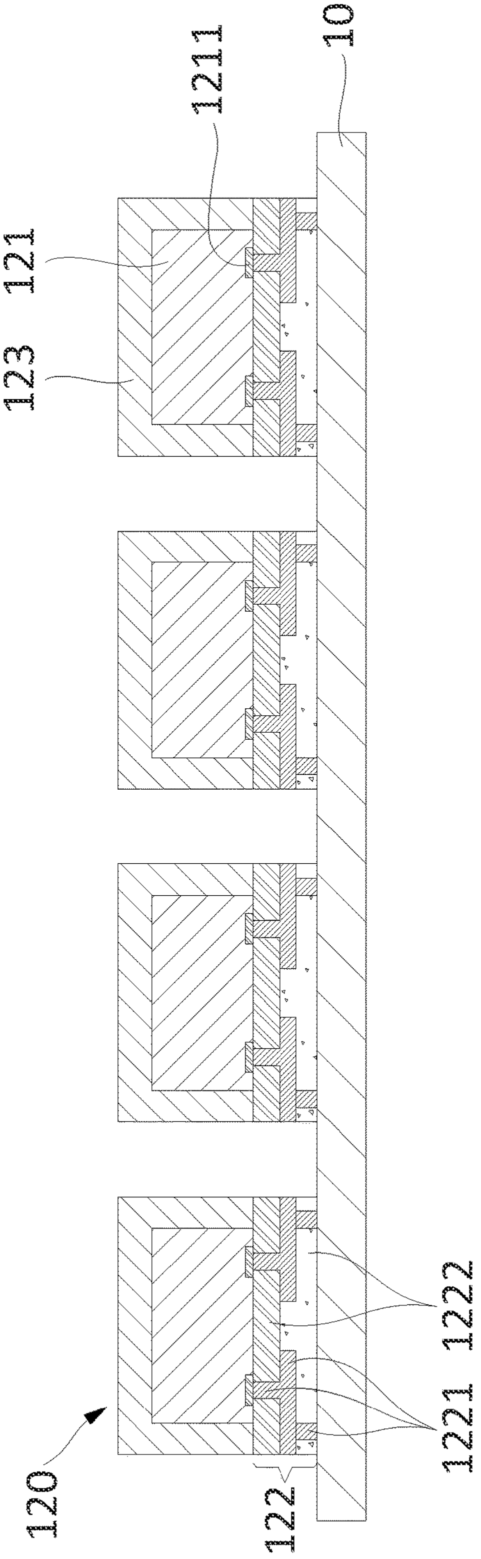

FIG. 2C shows a cross-sectional view of semiconductor device 100 at a later stage of manufacture. In the example shown in FIG. 2C, component modules 120 can be attached onto or provided on carrier 10. Component modules 120 can be attached onto carrier 10 to be a constant distance spaced apart from one another, and module substrate 122 can be brought into contact with carrier 10. Component modules 120 shown in FIG. 2B can be turned over to be attached onto carrier 10. In some examples, carrier 10 can comprise silicon, glass, a metal, an adhesive film, or an adhesive tape. In some examples, component modules 120 can be attached onto carrier 10 using an adhesion member.

Figure 2D:
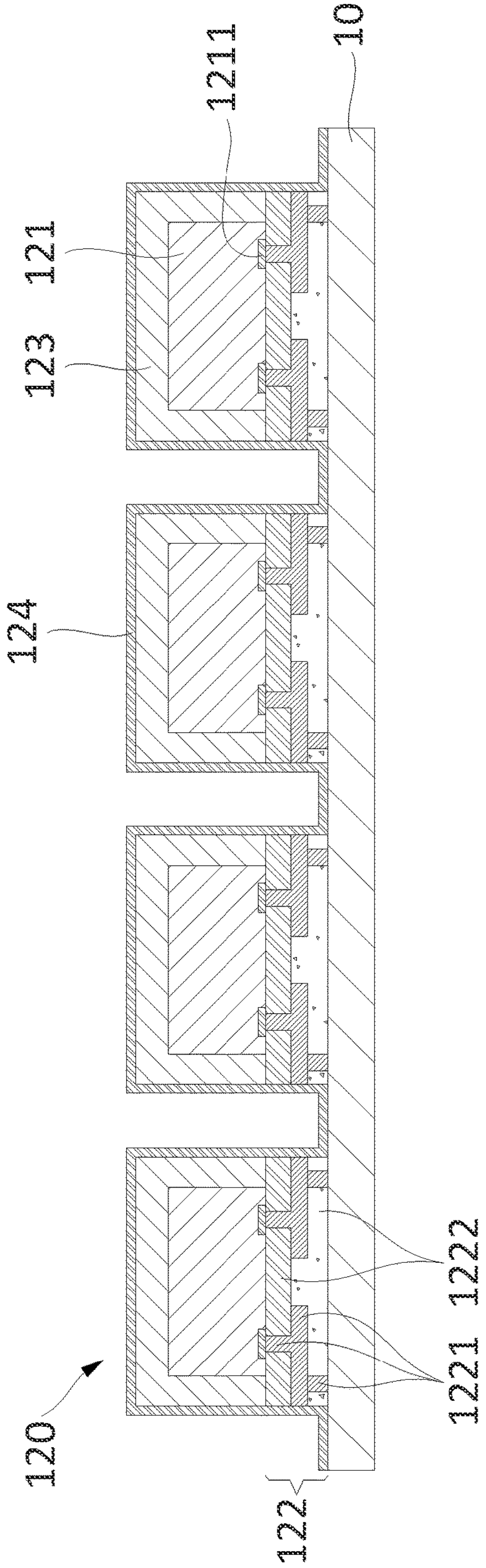

FIG. 2D shows a cross-sectional view of semiconductor device 100 at a later stage of manufacture. In the example shown in FIG. 2D, shield 124 can be formed on sides of component modules 120. Shield 124 can be formed on lateral sides of module substrate 122, and on lateral sides and the back side, opposite module substrate 122, of module encapsulant 123. Shield 124 can be also formed on carrier 10 between each of component modules 120. Shield 124 can comprise or be referred to as a conformal shield or an electro-magnetic-interference (EMI) shield. In some examples, shield 124 can comprise a metal. In some examples, shield 124 can be formed by sputtering, spray coating, or plating. Shield 124 can restrict electromagnetic waves from entering into or leaving from respective component modules 120. In some examples, shield 124 can prevent electromagnetic interference between adjacent component modules 120. In some examples, shield 124 can have a thickness in the range from about 50 nm to about 100 μm. Shield 124 can be optional in some examples.

Figure 2E:
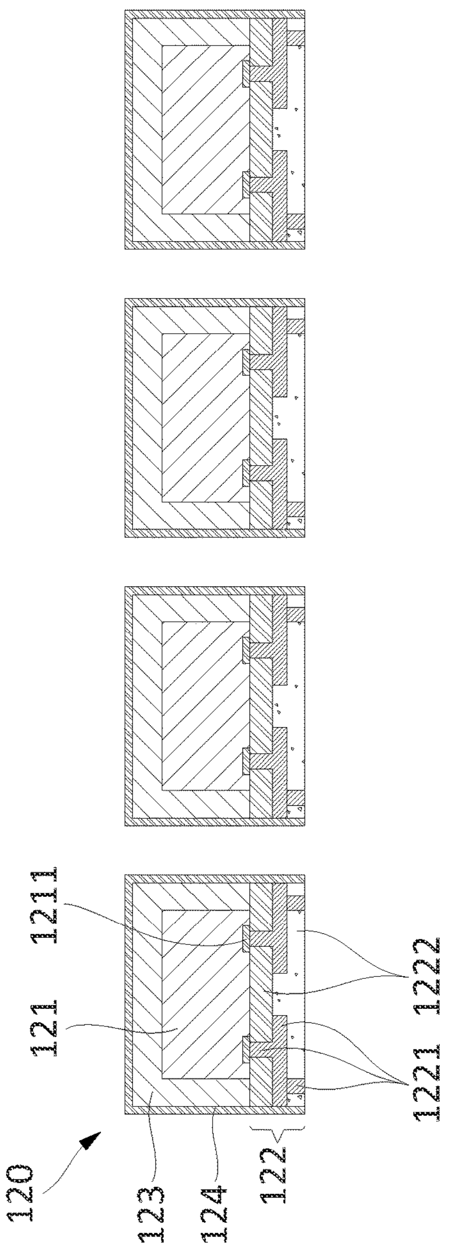

FIG. 2E shows a cross-sectional view of semiconductor device 100 at a later stage of manufacture. In the example shown in FIG. 2E, carrier 10 positioned under the component modules 120 can be removed or separated. In some examples, carrier 10 can be removed or separated from component modules 120 by grinding, heating, a chemical material, photo or ultraviolet (UV) rays, or by physical force. In some examples, portions of shield 124 contacting carrier 10 can also be removed along with carrier 10. In some examples, electronic component 121, module substrate 122, module encapsulant 123, and shield 124 can comprise or be referred to as component module 120.

Figure 2F:
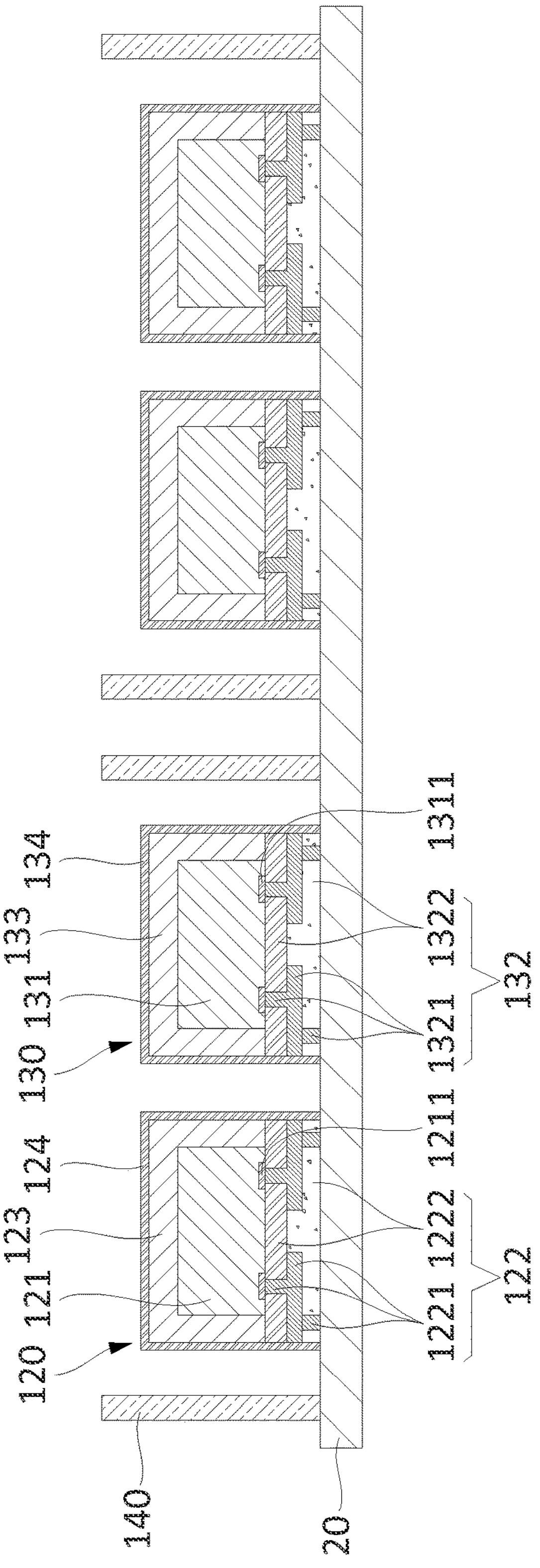

FIG. 2F shows a cross-sectional view of semiconductor device 100 at a later stage of manufacture. In the example shown in FIG. 2F, one or more component modules 120 and one or more component modules 130 can be positioned on carrier 20, respectively. Optionally, vertical interconnects 140 can be formed on carrier 20 adjacent to lateral sides of component modules 120 or component modules 130. Component modules 120 can be attached face-down such that module substrate 122 faces carrier 20. Component modules 130 can be a constant distance apart from component modules 120 and can be similarly attached to carrier 20. Component modules 130 can be attached such that module substrate 132 faces carrier 20.

In some examples, component module 130 can comprise corresponding elements, features, materials, or formation processes similar to those of component module 120 previously described. For example, electronic component 131, component terminal 1311, module substrate 132, conductive structure 1321, dielectric structure 1322, module encapsulant 133, or shield 134 of component module 130 can respectively correspond or be similar to electronic component 121, component terminal 1211, module substrate 122, module conductive structure 1221, module dielectric structure 1222, module encapsulant 123, or shield 124, respectively, of component module 120 previously described.

In some examples, component module 130 can be similar to component module 120 in terms of functionality or dimensions. In some examples, electronic component 131 of component module 130 can be similar to electronic component 121 of component module 120. In some examples, component module 130 or electronic component 131 can be respectively different from component module 120 or electronic component 121 in terms of functionality or dimensions. Shields 124 or 134 can restrict EMI between electronic component 131 of component module 130 and electronic component 121 of component module 120. In some examples, shields 124 or 134 can restrict EMI from being emitted from component modules 220 or 230, or can restrict external EMI from entering into component modules 220 or 230. In some examples, shields 124 or 134 or can serve as a path or heat sink for heat to be dissipated from component modules 120 or 130. In some examples, shields 124 or 134 can contact main substrate 110. In some examples, shields 124 or 134 can contact a conductor of main substrate 110, for example a portion of main conductive structure 111. In some examples, heat can be dissipated from electronic components 121 or 131 through shields 124 or 134, through a conductor of main substrate 110 such as main conductive structure 111, and through external interconnects 160. In some examples, shields 124 or 134 can contact a conductor of module substrates 122 or 132 such as module conductive structures 1221 or 1321. In some examples, heat can be dissipated from electronic components 121 or 131 through shields 124 or 134, through a conductor of module substrates 122 or 132 such as module conductive structures 1221 or 1321, through a conductor of main substrate 110 such as main conductive structure 111, and through external interconnects 160.

In some examples, vertical interconnects 140 can comprise or be referred to as package-on-package interconnects, pillars, posts, vias, or vertical wires. In some examples, vertical interconnects 140 can comprise an electrically conductive material, such as copper (Cu), aluminum (Al), palladium (Pd), titanium (Ti), tungsten (W), titanium/tungsten, nickel (Ni), gold (Au), or silver (Ag). Vertical interconnects 140 can be formed by any of a variety of processes, for example electroplating, electroless plating, sputtering, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), or wirebonding. In some examples, vertical interconnects 140 can have a height in the range from about 30 μm to about 1800 μm. In some examples, vertical interconnects 140 can have greater heights than component module 120 or component module 130. Vertical interconnects 140 can provide electrical couplings between semiconductor device 100 and an external component.

Figure 2G:
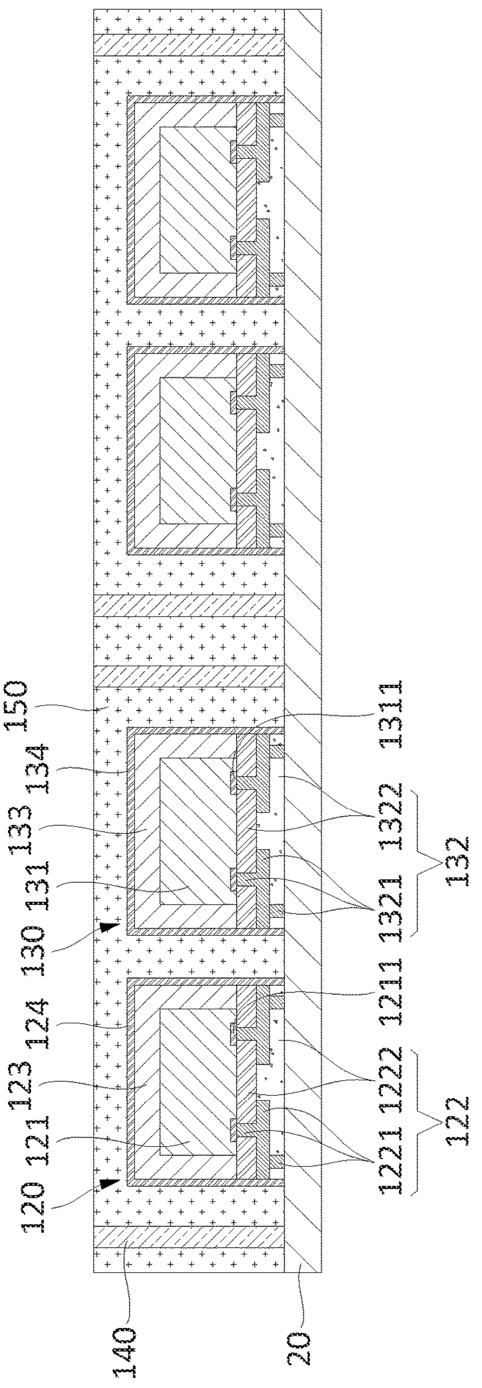

FIG. 2G shows a cross-sectional view of semiconductor device 100 at a later stage of manufacture. In the example shown in FIG. 2G, main encapsulant 150 can encapsulate component module 120, component module 130, or vertical interconnects 140. Main encapsulant 150 can be provided over carrier 20 and can encapsulate or contact lateral sides of component modules 120 or 130 and lateral sides of vertical interconnects 140. In some examples, main encapsulant 150 encapsulates back sides, opposite module substrates 122 or 132, of component modules 120 or 130, but there can be examples where the back sides of component modules 120 or 130 be exposed from main encapsulant 150. In some examples, main encapsulant 150 can initially fully encapsulate component modules 120 or 130 or vertical interconnects 140, and then a portion of main encapsulant 150 can be ground to expose ends of vertical interconnects 140, or the back sides of component modules 120 or 130, coplanar with main encapsulant 150.

Main encapsulant 150 can comprise or be referred to as a protective material, a mold compound or a resin. In some examples, main encapsulant 150 can comprise a variety of encapsulating or molding materials, for example a resin, a polymer compound, a polymer having inorganic fillers, an epoxy resin, an epoxy resin having fillers, an epoxy acrylate having fillers, a silicone resin, or the like. Main encapsulant 150 can be formed by a variety of processes including, for example, a compression molding process, a liquid phase encapsulant molding process, a vacuum lamination process, a paste printing process, or a film assisted molding process. Main encapsulant 150 can have a thickness in the range from about 30 μm to about 1800 μm. Main encapsulant 150 can provide structural integrity or protection for component module 120, component module 130, and vertical interconnects 140, from external elements or environmental exposure.

Figure 2H:
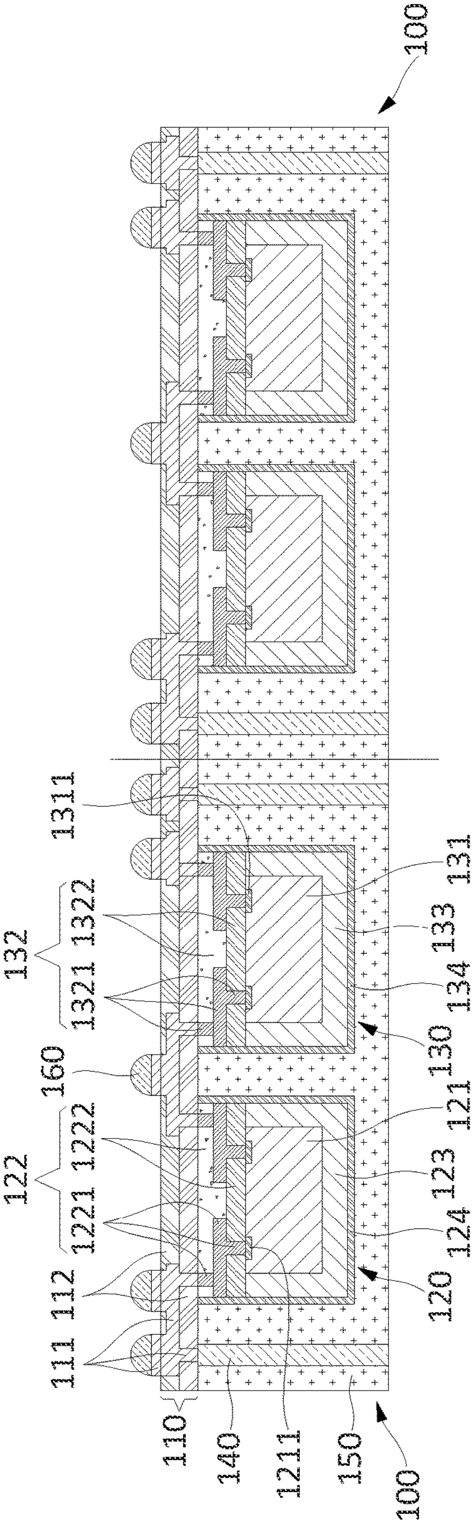

FIG. 2H shows a cross-sectional view of semiconductor device 100 at a later stage of manufacture. In the example shown in FIG. 2H, carrier 20 can be removed or separated, and main substrate 110 comprising main conductive structure 111 and main dielectric structure 112 can be formed. In some examples, carrier 20 can be removed or separated from main substrate 110 by grinding, heating, a chemical material, photo or UV rays, or a physical force, and module substrates 122 or 132 of component modules 120 or 130 can be exposed. In some examples, module substrates 122 or 132 can be turned over to face upward, and main substrate 110 can then be formed on module substrates 122 or 132 and on main encapsulant 150. In some examples, main substrate 110 can be formed over main encapsulant 150 and component modules 120 or 130. In some examples, main substrate 110 can cover or can be connected to portions of module substrates 122 or 132, of main encapsulant 150, or of vertical interconnects 140. In some examples, main encapsulant 150 can cover a major side of component modules 120 or 130 such that component modules 120 or 130 are not exposed through main encapsulant 150.

In some examples, main substrate 110 can comprise or be referred to as a redistribution structure, an RDL substrate, a buildup substrate, a wafer-level or panel-level substrate, or a fan-out substrate. In some examples, main substrate 110 can comprise a laminate substrate or a pre-formed substrate. Main substrate 110 can provide electrical connection between component module 120, component module 130, or external interconnects 160. Main substrate 110 can provide electrical connection between component module 120, component module 130, or vertical interconnects 140. Main substrate 110 can extend beyond a footprint of component modules 120 or 130 to form a fan-out redistribution structure. In some examples, main substrate 110 can have a thickness in the range from about 2 μm to about 300 μm. In some examples, main substrate 110 can be similar to module substrate 122 or 132 in terms of structure or formation.

Main conductive structure 111 can comprise or be referred to as one or more traces, pads, terminals, vias, UBMs, conductors, conductive materials, conductive patterns, conductive paths, conductive layers, redistribution layers (RDLs), wiring patterns, trace patterns, or circuit patterns. Main conductive structure 111 can comprise, for example, an electrically conductive material, such as copper (Cu), aluminum (Al), palladium (Pd), titanium (Ti), tungsten (W), titanium/tungsten, nickel (Ni), gold (Au), or silver (Ag). Main conductive structure 111 can be formed by, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). Main conductive structure 111 can be electrically connected to module conductive structures 1221 or 1321 of component modules 120 or 130. In some examples, main conductive structure 111 can be electrically connected to vertical interconnects 140. Main conductive structure 111 can transfer or redistribute signals, current or voltages through main substrate 110. In some examples, main conductive structure 111 can have a thickness in the range from about 2 μm to about 300 μm. In some examples, main conductive structure 111 can be similar to module conductive structure 1221 or 1321 in terms of structure or formation.

Main dielectric structure 112 can comprise or be referred to as dielectric layers, passivation layers, thin-film layers, or buildup layers. In some examples, main dielectric structure 112 can comprise or be referred to as one or more dielectric layers, solder mask layers, core layers, or prepreg layers. Main dielectric structure 112 can comprise an electrically insulating material such as a polymer, polyimide (PI), polypropylene (PP), polyethylene (PE), benzocyclobutene (BCB), polybenzoxazole (PBO), bismaleimide triazine (BT), a molding material, a phenol resin, epoxy, silicone, or an acrylate polymer. In some examples, main dielectric structure 112 can be formed by thermal oxidation, chemical vapor deposition (CVD), physical vapor deposition (PVD), atomic layer deposition (ALD), low pressure chemical vapor deposition (LPCVD), plasma enhanced chemical vapor deposition (PECVD), sheet lamination, printing, spin coating, spray coating, sintering, or evaporating. Main dielectric structure 112 can provide structural integrity or protection for main conductive structure 111 from external elements or environmental exposure. In some examples, main dielectric structure 112 can expose a terminal of main conductive structure 111 from main substrate 110. In some examples, main dielectric structure 112 can have a thickness in the range from about 2 μm to about 300 μm. In some examples, main dielectric structure 112 can be similar to module dielectric structure 1222 or 1322 in terms of structure or formation. In some examples, module substrates 122 or 132 can contact a back side of main substrate 110.

In the example shown in FIG. 2H, external interconnects 160 can be connected to exposed terminals of main conductive structure 111 of main substrate 110. External interconnects 160 can be electrically connected to vertical interconnects 140 or electronic components 121 and 131 through main conductive structure 111. In some examples, external interconnects 160 can comprise or be referred to as conductive bumps, lands, balls, pillars, posts, or solder balls. External interconnects 160 can comprise tin (Sn), silver (Ag), lead (Pb), copper (Cu), Sn—Pb, $Sn_{37}$—Pb, $Sn_{95}$—Pb, Sn—Pb—Ag, Sn—Cu, Sn—Ag, Sn—Au, Sn—Bi, or Sn—Ag—Cu. External interconnects 160 can be formed by, for example, a ball drop process, a screen-printing process, an electroplating process, or a deposition process. External interconnects 160 can have a height in the range from about 2 μm to about 400 μm. External interconnects 160 can provide electrical connection between semiconductor device 100 and an external component.

Figure 2I:
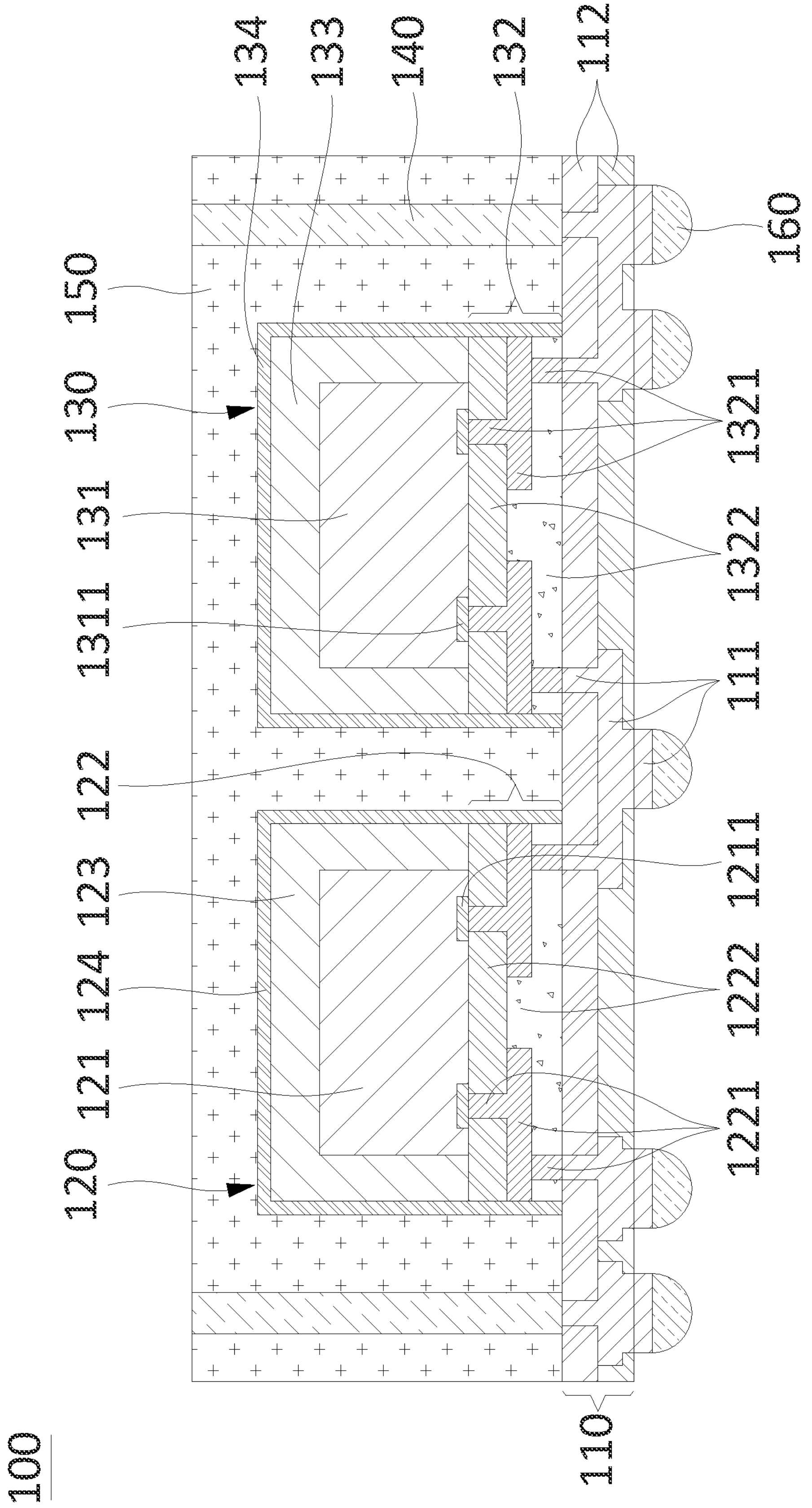

As shown in FIG. 2H and FIG. 2I, a singulation or sawing process can be performed to separate individual semiconductor devices 100 from one another. In some examples, the singulation or sawing process can be performed using a sawing tool, such as a blade or laser beam. Singulation can be performed through main substrate 110 and main encapsulant 150 can be singulated, and semiconductor devices can be separated from each other along the singulation lines shown in FIG. 2H. In some examples, main encapsulant 150 can be singulated or sawed to provide semiconductor devices 100 comprising two or more component modules, for example component modules 120 and 130.

Figure 3:
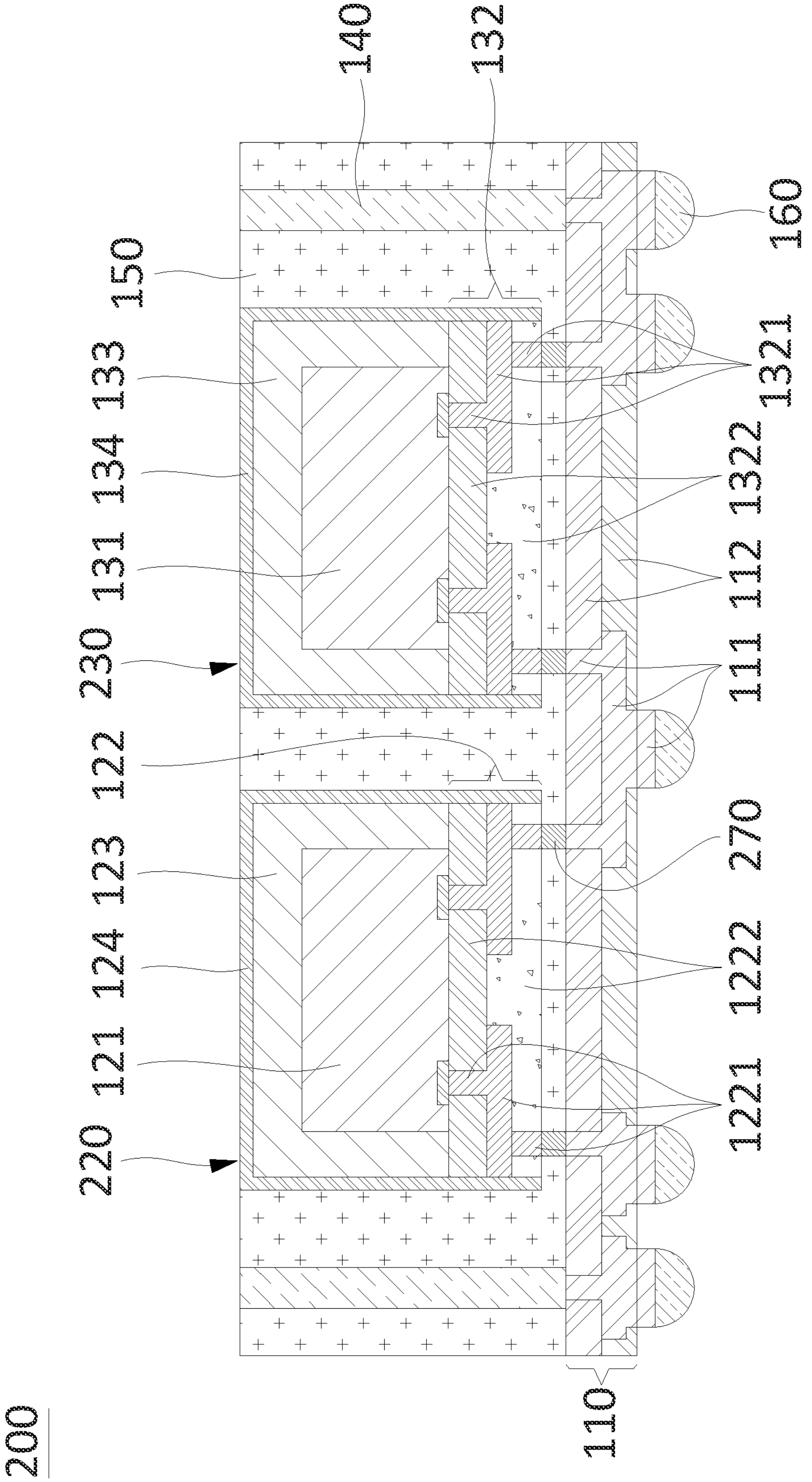
FIG. 3 shows a cross-sectional view of an example semiconductor device.

FIG. 3 shows a cross-sectional view of an example semiconductor device 200. In the example shown in FIG. 3, semiconductor device 200 can comprise main substrate 110, component module 220, component module 230, vertical interconnects 140, main encapsulant 150, external interconnects 160, and module interconnects 270.

Semiconductor device 200 can be similar to semiconductor device 100, or can comprise corresponding elements, features, materials, or formation processes similar to those of semiconductor device 100 previously described. In some examples, main substrate 110, vertical interconnects 140, main encapsulant 150, external interconnects 160, and module interconnects 270 can be referred to as a semiconductor package or a package, which can provide protection for component module 220 and component module 230 from external elements or environmental exposure. The semiconductor package can provide electrical couplings between an external component and component modules 220 and 230. In some examples, a major side of component modules 120 or 130 can be exposed through main encapsulant 150. In some examples, a major side of shields 124 or 134 can be exposed through main encapsulant 150.

Figure 4A:
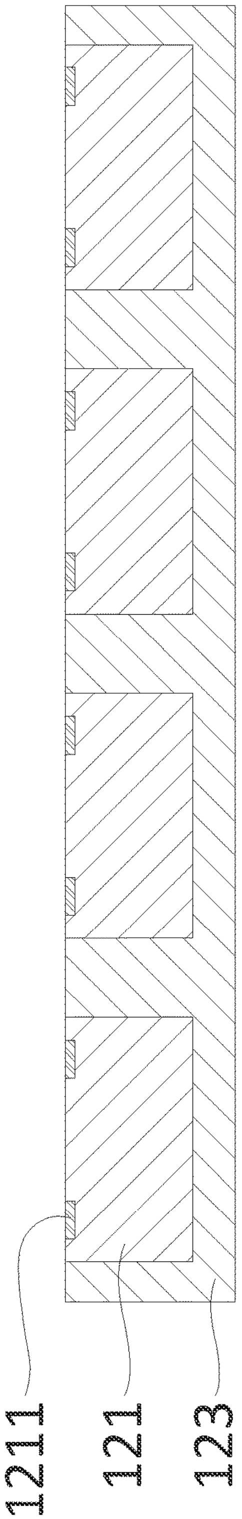
FIGS. 4A to 4I show cross-sectional views of an example method for manufacturing an example semiconductor device.

FIGS. 4A to 4I show cross-sectional views of an example method for manufacturing an example semiconductor device. FIG. 4A shows a cross-sectional view of semiconductor device 200 at an early stage of manufacture.

In the example shown in FIG. 4A, module encapsulant 123 can encapsulate more than one electronic components 121. Aspects of the stage shown in FIG. 4A can be similar to those of the stage previously described for FIG. 2A. Module encapsulant 123 can expose component terminals 1211 at front sides of electronic components 121.

Figure 4B:
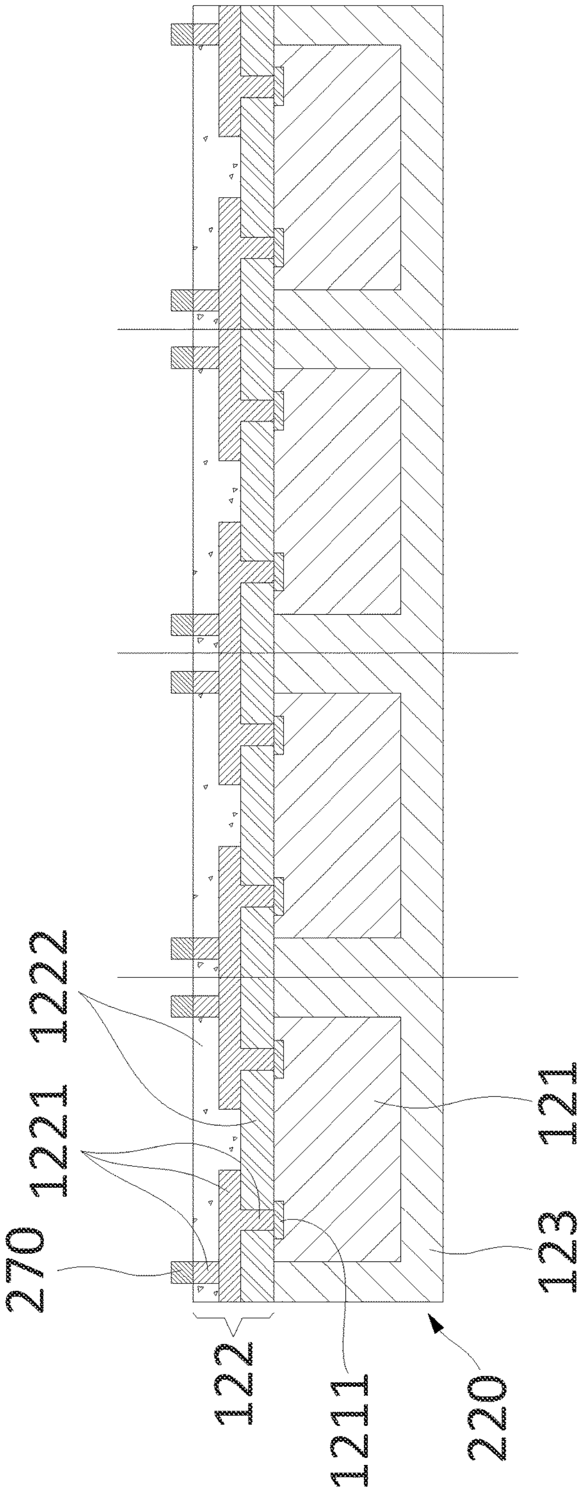

FIG. 4B shows a cross-sectional view of semiconductor device 200 at a later stage of manufacture. Aspects of the stage shown in FIG. 4B can be similar to those of the stage previously described for FIG. 2B. In the example shown in FIG. 4B, module substrate 122 comprising module conductive structure 1221 and module dielectric structure 1222 can be formed on electronic component 121 and module encapsulant 123. In some examples, module interconnects 270 can be formed on module conductive structure 1221.

Module interconnects 270 can comprise or be referred to as conductive bumps, balls, pillars, posts, or solder balls. Module interconnects 270 can be formed on terminals of module conductive structure 1221 exposed by module dielectric structure 1222 and can be electrically connected to module conductive structure 1221. In some examples, module interconnects 270 can be electrically connected to electronic component 121 through module conductive structure 1221. In some examples, module interconnects 270 can comprise an electrically conductive material such as copper (Cu), aluminum (Al), palladium (Pd), titanium (Ti), tungsten (W), titanium/tungsten, nickel (Ni), gold (Au), or silver (Ag). Module interconnects 270 can be formed by, for example, a ball drop process, a screen-printing process, an electroplating process or a deposition process. Module interconnects 270 can have a vertical thickness in the range from about 2 μm to about 1000 μm. Module interconnects 270 can provide electrical coupling between component module 120 and main substrate 110.

In the example shown in FIG. 4B, singulation can be performed to separate electronic components 121 from each other. Aspects of the stage shown in FIG. 4B can be similar to those of the stage previously described for FIG. 2B. During the singulation process, module encapsulant 123 and module substrate 122 can be cut, and electronic components 121 can be separated from each other along the singulation lines shown. In some examples, singulated electronic component 121, module encapsulant 123, module substrate 122, and module interconnects 270 can be referred to as component module 220. Component module 220 can be similar to component module 120 previously described, and comprises module interconnects 270.

Figure 4C:
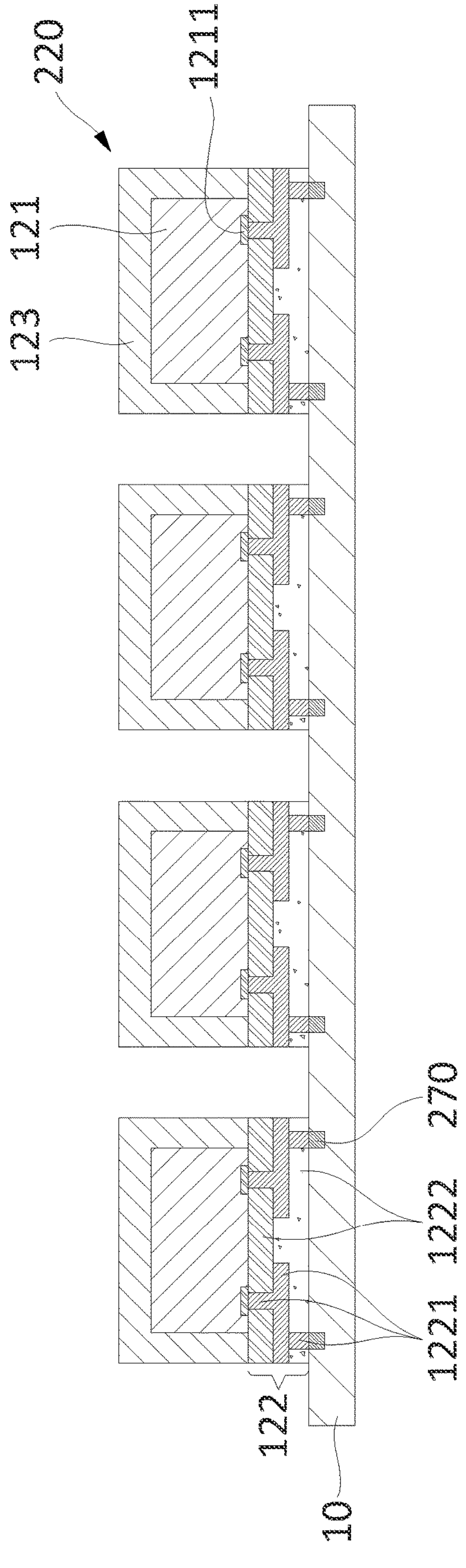

FIG. 4C shows a cross-sectional view of semiconductor device 200 at a later stage of manufacture. Aspects of the stage shown in FIG. 4C can be similar to those of the stage previously described for FIG. 2C. In the example shown in FIG. 4C, component modules 220 can be attached to carrier 10. Component modules 220 can be attached to carrier 10 at a constant distance apart from one another, and module interconnects 270 can be brought into contact with carrier 10. Component modules 220 shown in FIG. 4B can be turned over to then be attached onto carrier 10. In some examples, module interconnects 270 protruding from module substrate 122 penetrate into carrier 10, and module substrate 122 can be brought into contact with carrier 10. In some examples, carrier 10 can comprise silicon, glass, a metal, an adhesive film, or an adhesive tape. In some examples, component modules 220 can be attached onto carrier 10 using an adhesion member.

Figure 4D:
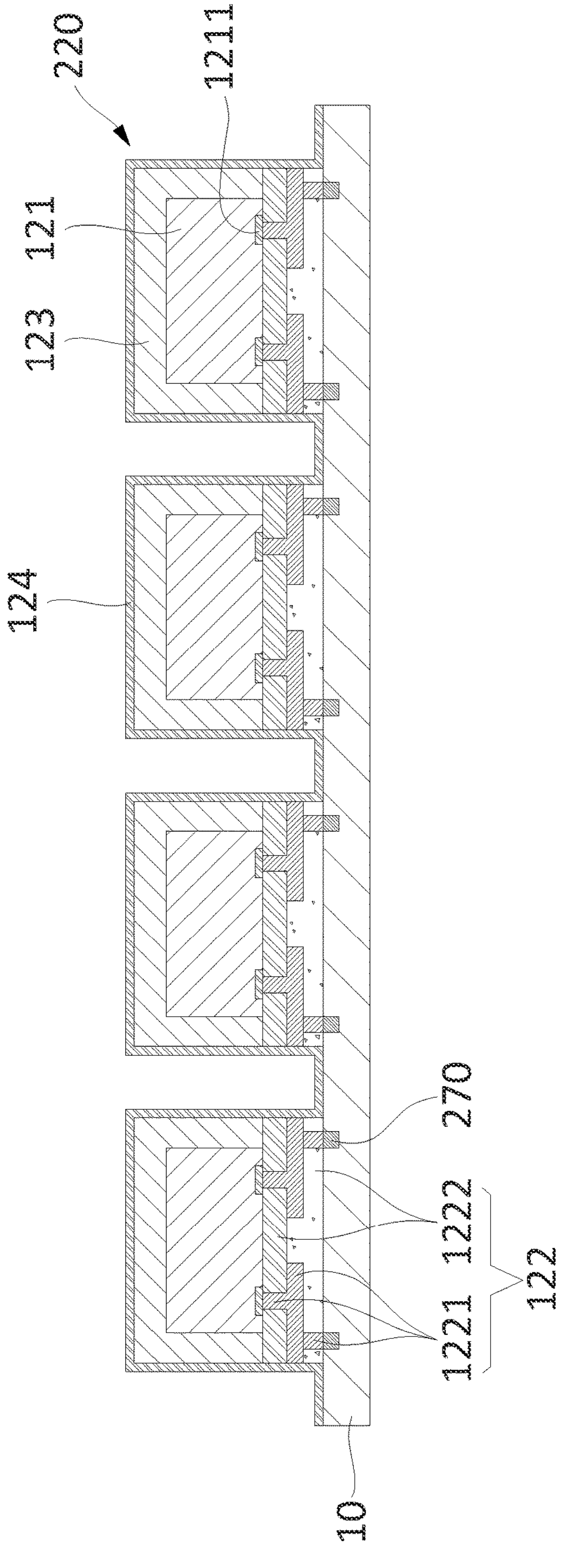

FIG. 4D shows a cross-sectional view of semiconductor device 200 at a later stage of manufacture. Aspects of the stage shown in FIG. 4D can be similar to those of the stage previously described for FIG. 2D. In the example shown in FIG. 4D, shield 124 can be formed on component modules 220. Shield 124 can be formed on lateral sides of module substrate 122 and on lateral and back sides, opposite module substrate 122, of module encapsulant 123. Shield 124 can be formed on carrier 10 between each of component modules 220. Since module interconnects 270 are positioned within carrier 10, shield 124 may not be formed on lateral sides of module interconnects 270.

Figure 4E:
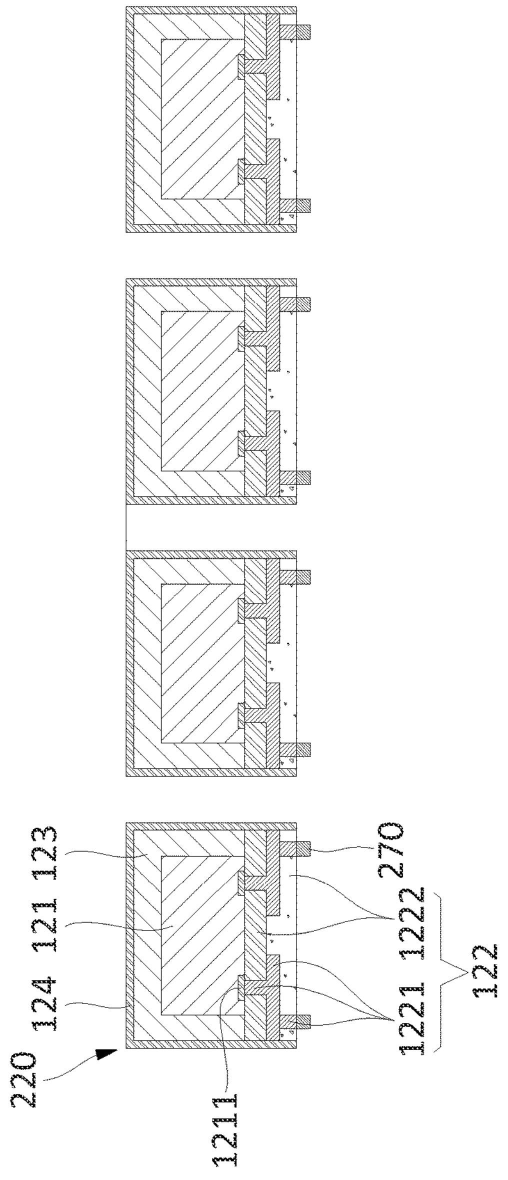

FIG. 4E shows a cross-sectional view of semiconductor device 200 at a later stage of manufacture. Aspects of the stage shown in FIG. 4E can be similar to those of the stage previously described for FIG. 2E. In the example shown in FIG. 4E, carrier 10 positioned under module packages can be removed or separated from component modules 220. In some examples, carrier 10 can be removed or separated from the module packages by grinding, heating, a chemical material, photo, or UV rays, or a physical force. When carrier 10 is removed, the portion of shield 124 formed on carrier 10 can also be removed. Electronic component 121, module substrate 122, module encapsulant 123, module interconnects 270, and shield 124 can be referred to as component module 220.

Figure 4F:
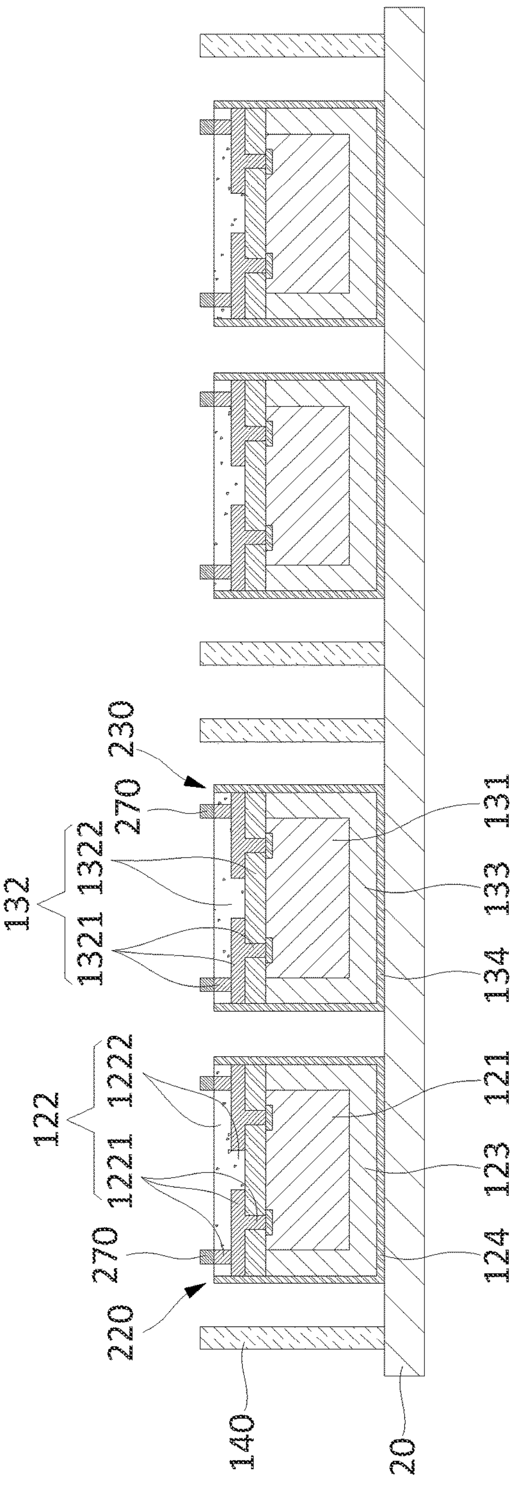

FIG. 4F shows a cross-sectional view of semiconductor device 200 at a later stage of manufacture. Aspects of the stage shown in FIG. 4F can be similar to those of the stage previously described for FIG. 2F. In the example shown in FIG. 4F, one or more component modules 220 and one or more component modules 230 can be positioned on carrier 20, respectively. Optionally, vertical interconnects 140 can be formed on carrier 20 adjacent to lateral sides of component modules 220 or component modules 230.

Component modules 220 can be attached face-up such that module substrate 122 and module interconnects 270 face away from carrier 20. Component modules 230 can be a constant distance apart from component modules 220 and can be similarly attached to carrier 20. Component modules 230 can be attached face-up such that module substrate 132 and module interconnects 270 face away from carrier 20. In some examples, component module 230 can be similar to component modules 130 previously described, and can comprise module interconnects 270. Shields 124 or 134 can restrict EMI between electronic component 131 of component module 230 and electronic component 121 of component module 220. In some examples, shields 124 or 134 can restrict EMI from being emitted from component modules 220 or 230, or can restrict external EMI from entering into component modules 220 or 230. Vertical interconnects 140 can be formed on carrier 20 adjacent lateral sides of component modules 220 or 230. In some examples, vertical interconnects 140 can have a height equal to or greater than a height of module interconnects 270 over carrier 20.

Figure 4G:
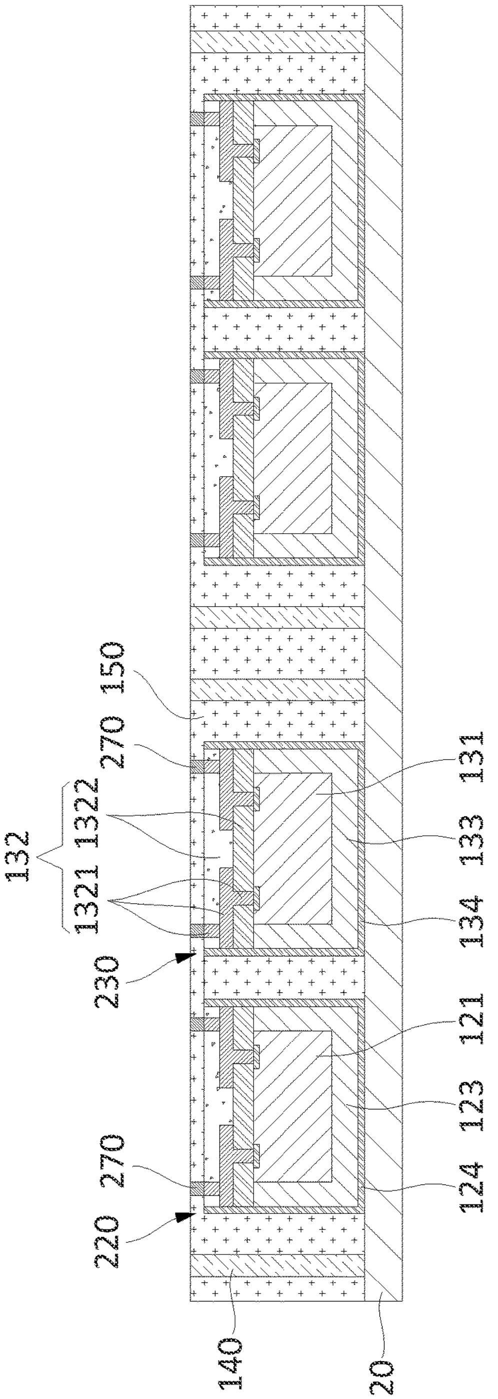

FIG. 4G shows a cross-sectional view of semiconductor device 200 at a later stage of manufacture. Aspects of the stage shown in FIG. 4G can be similar to those of the stage previously described for FIG. 2G. In the example shown in FIG. 4G, main encapsulant 150 can encapsulate component module 220, component module 230, vertical interconnects 140, or module interconnects 270.

Main encapsulant 150 can encapsulate front sides, adjacent module substrates 122 or 132, and lateral sides of component modules 220 or 230, lateral sides of vertical interconnects 140, and lateral sides of module interconnects 270. In some examples, main encapsulant 150 can initially fully encapsulate vertical interconnects 140 or module interconnects 270, and then a grinding process can remove portions of main encapsulant 150, of module interconnects 270, or of vertical interconnects 140, to define and expose ends of vertical interconnects 140 or ends of module interconnects 270 coplanar with main encapsulant 150.

Figure 4H:
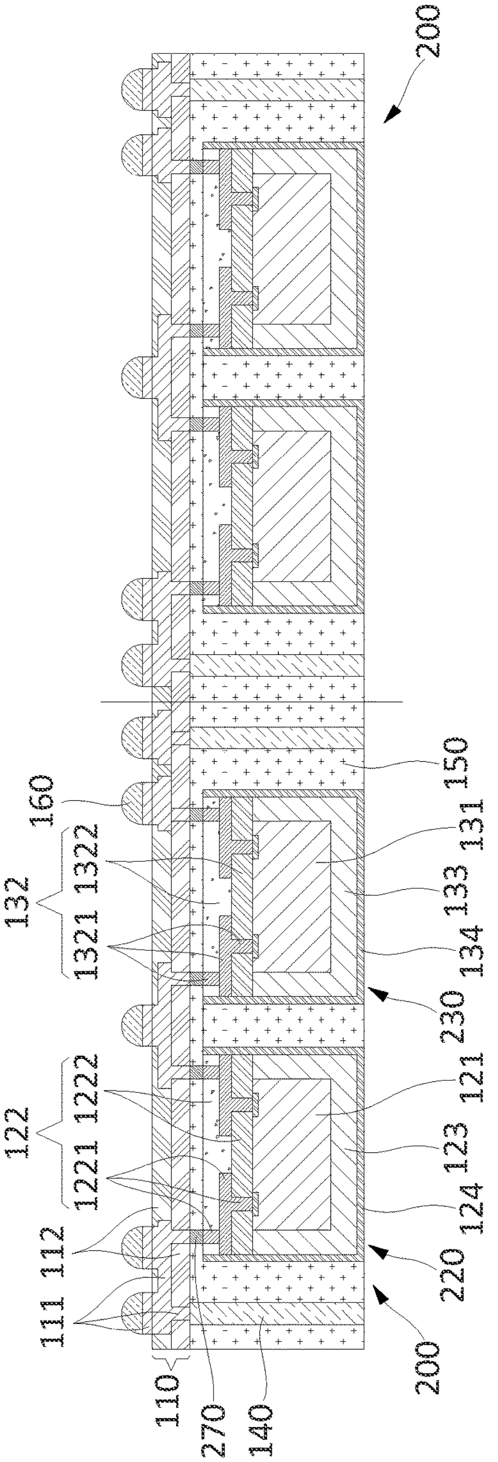

FIG. 4H shows a cross-sectional view of semiconductor device 200 at a later stage of manufacture. Aspects of the stage shown in FIG. 4H can be similar to those of the stage previously described for FIG. 2H. In the example shown in FIG. 4H, carrier 20 can be removed, and main substrate 110 can be formed on module substrates 122 or 132, on main encapsulant 150, or on vertical interconnects 140. In some examples, carrier 20 can be removed or separated by grinding, heating, a chemical material, photo or UV rays, or a physical force. In some examples, shields 124 or 134 of component modules 220 or 230 can be exposed when carrier 20 is removed. Shields 124 or 134 can restrict EMI as described above, or can serve as a path or heat sink for heat to be dissipated from component modules 220 or 230.

Figure 4I:
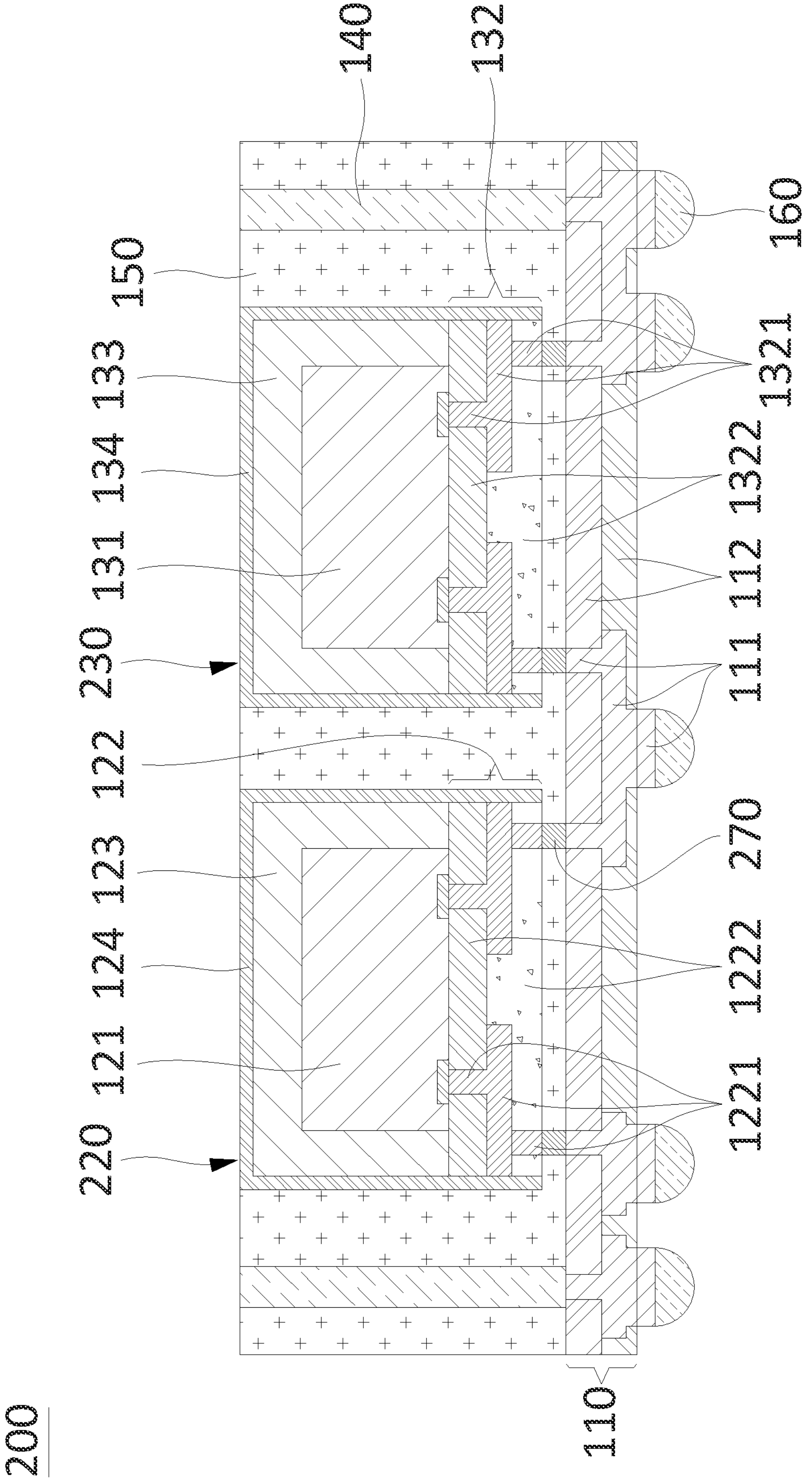

Main substrate 110 can be formed such that main conductive structure 111 is connected to component modules 220 or 230 through module interconnects 270. External interconnects 160 can be connected to main conductive structure 111 of main substrate 110. Main substrate 110 can provide electrical connection between external interconnects 160 and vertical interconnects 140. Main substrate 110 can provide electrical connection between module interconnects 270 and vertical interconnects 140. Main conductive structure 111 of main substrate 110 can be electrically connected to module interconnects 270 or to vertical interconnects 140. Main substrate 110 and main encapsulant 150 can be subjected to singulation along the singulation lines shown, to provide individual semiconductor devices 200 as shown in FIG. 4I.

In some implementations, semiconductor devices 100 or 200 can provide individualized shielding or heat management options for component modules 120, 130, 220, or 230 as part of respective semiconductor devices 100 or 200. In some examples, the modularized structure of semiconductor devices 100 or 200 can permit better control of warpage. The characteristic thermal expansion (CTE) of the different materials, such as the encapsulant, the semiconductor, and the conductive layers and dielectric layers of the substrate, can induce warpage during manufacture. Oftentimes the method to control warpage is limited to controlling the specific gravity and thickness of the encapsulant around the semiconductor die to account for thermal expansion. Semiconductor device 100 or 200 can have further variables that can be adjusted for controlling the warpage. For instance, warpage can be restrained for semiconductor device 100 or 200 by controlling the size, thickness, or composition of module encapsulant 123 or 133, the size or thickness of component module 120, 130, 220, or 230, or size, thickness, or composition of main encapsulant 150. In some examples, the modularized structure of semiconductor devices 100 or 200 can relieve warpage-inducing strain at an interface, such as shield 124 or 134, between component modules 120, 130, 220, or 230, and main encapsulant 150.

The present disclosure includes reference to certain examples. It will be understood, however, by those skilled in the art that various changes can be made, and equivalents can be substituted without departing from the scope of the disclosure. In addition, modifications can be made to the disclosed examples without departing from the scope of the present disclosure. It is therefore intended that the present disclosure is not limited to the examples disclosed, but that the disclosure will include all examples falling within the scope of the appended claims.

The invention claimed is:

1. A method of making a semiconductor device, comprising:

providing a first component module comprising a first electronic component and a first module encapsulant disposed around the first electronic component;

providing a second component module comprising a second electronic component and a second module encapsulant disposed around the second electronic component;

providing a vertical interconnect laterally offset from the first component module, wherein the vertical interconnect comprises an electrically conductive material to provide an electrical coupling to an external component;

providing a main encapsulant between the first component module and the second component module; and providing a main substrate comprising a main conductive structure;

wherein the first component module, the second component module, the vertical interconnect, and the main encapsulant are disposed over a top side of the main substrate; and wherein the first component module, the second component module, and the vertical interconnect are coupled to the main conductive structure;

wherein the vertical interconnect is external to the first module encapsulant and the second module encapsulant, and is surrounded by the main encapsulant;

wherein a first portion of the main encapsulant is between the first component module and the vertical interconnect, the vertical interconnect is between a second portion of the main encapsulant and the first portion of the main encapsulant, and the first portion of the main encapsulant and the second portion of the main encapsulant contact the vertical interconnect; and wherein the main encapsulant contacts the top side of the main substrate.

2. The method of claim 1, comprising:

providing a module interconnect coupled to the first component module; and coupling the module interconnect to the main conductive structure;

wherein the main encapsulant covers the module interconnect.

3. The method of claim 1, wherein:

one end of the vertical interconnect is exposed external to the main encapsulant.

4. The method of claim 1, wherein:

a top side of the first component module is exposed from the main encapsulant.

5. The method of claim 1, wherein:

the main encapsulant covers a top side of the first component module.

6. The method of claim 1, wherein:

the main substrate is provided after the main encapsulant is provided; and the main encapsulant extends underneath the first component module between a top side of the main substrate and a bottom side of the of the first component module.

7. The method of claim 1, wherein:

the main substrate is provided before the main encapsulant is provided.

8. A method, comprising:

providing a first component module comprising a first electronic component and a first module encapsulant disposed around the first electronic component;

disposing a shield over the first module encapsulant;

providing a second component module comprising a second electronic component and a second module encapsulant disposed around the second electronic component disposing a main encapsulant around the shield and the second component module; and providing a main substrate comprising a main conductive structure;

wherein the first component module and the second component module are over a top side of the main substrate and coupled to the main conductive structure;

wherein a vertical side of the shield is between the first module encapsulant and the main encapsulant;

wherein a top side of the shield is covered by the main encapsulant, and the vertical side of the shield is covered by the main encapsulant.

9. The method of claim 8, comprising:

providing a module interconnect coupled to the first component module; and coupling module interconnect to the main conductive structure;

wherein the main encapsulant covers the module interconnect.

10. The method of claim 8, wherein:

the main encapsulant covers a top side of the second component module.

11. The method of claim 8, wherein:

the main substrate is provided after the main encapsulant is provided.

12. The method of claim 8, wherein:

the main substrate is provided before the main encapsulant is provided.

13. A method, comprising:

providing a first component module comprising:

a first electronic component, a first module encapsulant disposed around the first electronic component, and a shield disposed over the first module encapsulant;

providing a first component interconnect coupled to the first component module;

providing a vertical interconnect laterally offset from the first component module, wherein the vertical interconnect comprises an electrically conductive material to provide an electrical coupling to an external component;

disposing a main encapsulant around the first component module and the vertical interconnect; and providing a main substrate comprising a main conductive structure;

wherein the first component module, the vertical interconnect, and the main encapsulant are over a top side of the main substrate; and wherein the first component module and the vertical interconnect are coupled to the main conductive structure;

wherein the vertical interconnect is external to the first module encapsulant and external to the shield;

wherein the shield is between the first module encapsulant and the main encapsulant; and wherein the main encapsulant is external to the shield and extends between a vertical side of the shield and the vertical interconnect.

14. The method of claim 13, comprising:

coupling the first component interconnect to the main conductive structure;

wherein the main encapsulant extends between the first component module and the top side of the main substrate.

15. The method of claim 13, wherein:

one end of the vertical interconnect is exposed external to the main encapsulant.

16. The method of claim 13, wherein:

a top side of the first component module is exposed from the main encapsulant.

17. The method of claim 13, wherein:

the main encapsulant covers a top side of the first component module.

18. The method of claim 13, wherein:

the main substrate is provided after the main encapsulant is provided.

19. The method of claim 13, wherein:

the main substrate is provided before the main encapsulant is provided.

* * * * *